United States Patent
Todi et al.

(10) Patent No.: US 10,107,843 B2
(45) Date of Patent: Oct. 23, 2018

(54) LOW POWER ON-CHIP IMPEDANCE DETECTOR

(71) Applicant: Dialog Semiconductor B.V., 's-Hertogenbosch (NL)

(72) Inventors: Rahul Todi, Eindhoven (NL); Johannes Gerardus Willms, Oosterhout (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 14/672,832

(22) Filed: Mar. 30, 2015

(65) Prior Publication Data

US 2016/0077140 A1 Mar. 17, 2016

(30) Foreign Application Priority Data

Sep. 12, 2014 (DE) .......................... 10 2014 013 605

(51) Int. Cl.
*G01R 27/02* (2006.01)
*H03H 7/40* (2006.01)

(52) U.S. Cl.
CPC ............... *G01R 27/02* (2013.01); *H03H 7/40* (2013.01)

(58) Field of Classification Search
CPC .................................. G01R 27/02; H03H 7/40
USPC ........................................................ 333/17.3
See application file for complete search history.

(56) References Cited

U.S. PATENT DOCUMENTS

| 2003/0030426 | A1 | 2/2003 | Pickerd |
| 2009/0174496 | A1* | 7/2009 | Van Bezooijen ......... H03F 1/56 333/17.3 |
| 2013/0222076 | A1* | 8/2013 | Yi ......................... G06K 7/0008 333/109 |

FOREIGN PATENT DOCUMENTS

| DE | 197 56 100 | 12/1997 |
| WO | WO 2006/030360 | 3/2006 |
| WO | WO 2006/038167 | 4/2006 |

OTHER PUBLICATIONS

"An Automatic Antenna Tuning System Using Only RF Signal Amplitudes," by E. L. Firrao, et al., IEEE Transactions on Circuits and Systems-II: Express Briefs, vol. 55, No. 9, Sep. 2008, pp. 833-837.
"A Mismatch Detector for Adaptive Antenna Impedance Matching," by Fanfan Meng, et al., Proceedings of the 36th European Microwave Conference, Sep. 2006, Manchester UK, pp. 1457-1460.

(Continued)

*Primary Examiner* — Stephen E Jones
*Assistant Examiner* — Scott S Outten
(74) *Attorney, Agent, or Firm* — Saile Ackerman LLC; Stephen B. Ackerman

(57) ABSTRACT

An impedance detector for measuring an impedance of a circuit comprises a frequency source, a resistor connected in between the frequency source and the circuit to be measured, a phase shift circuit for applying a phase shift to a signal from the frequency source, a first multiplier for mixing the signal from the frequency source with a signal from the circuit to be measured, a second multiplier for mixing the phase shifted signal with the signal from the circuit to be measured, and a processing circuit for determining an indication of an impedance of the circuit to be measured in dependence on the first mixed signal and the second mixed signal.

28 Claims, 3 Drawing Sheets

(56) References Cited

OTHER PUBLICATIONS

"Frequency agile antenna tuning and matching," by J.R. Moritz, et al., HF Radio Systems and Techniques, 2000, Eighth International Conference on (IEE Conf. Publ. No. 474), ISBN: 0-85296-727-6, Jul. 2000, pp. 169-174.

"A Precise and Sensitive X-Band Reflecto "meter" Providing Automatic Full-Band Display of Reflection Coefficient," by F. C. De Ronde, IEEE Transactions on Microwave Theory and Techniques, Jul. 1962, pp. 435-440.

Antenna Impedance Mismatch Measurement and Correction for Adaptive CDMA Transceivers, by Dongjiang Qiao, et al., 2005 IEEE, 0-7803-8846-1/05, Jun. 2005, pp. 783-786.

"Adaptive RF front-ends, providing resilience to changing environments," by Adrianus Van Bezooijen, Apr. 8, 2010, ISBN: 978-90-386-2184-5, pp. 54-57.

German Office Action, File No. 10 2014 013 605.1, Applicant: Dialog Semiconductor B.V., dated Aug. 3, 2015, 10 pgs and English language translation, 10 pgs.

\* cited by examiner

LOW POWER ON-CHIP IMPEDANCE DETECTOR

TECHNICAL FIELD

The invention relates to an impedance detector.

BACKGROUND

In a Radio Frequency (RF) frontend, the output of the power amplifier (PA) and the input of the Low Noise amplifier (LNA) are known to be connected to a matching network. The purpose of the PA matching network is to provide the output of the PA with the optimum load impedance for maximum efficiency and a certain desired output power level. The purpose of the LNA matching network is to provide the input of the LNA with the optimum source impedance for the lowest possible noise figure. The outputs of these matching networks are connected to a switching device, which will connect the attached antenna either to the PA matching network (transmit mode) or the LNA matching network (receive mode). RF frontends with PA and LNA having a separate output and input respectively are also known.

Most of the time an antenna is designed for a situation in which the direct environment of the antenna does not change. However, in practice, the antenna will experience a varying environment. This change in the environment can be initiated e.g. by placing the antenna on a human body or on a surface with other properties than what was designed for. This change in environment has an impact on the electrical input impedance and other performance parameters of the antenna.

The change in the electrical input impedance can be measured in several ways. Some of these techniques are outlined below.

"A precise and sensitive X-band reflecto-meter providing automatic full-band display of reflection coefficient", F. C. de Ronde, IEEE Transactions on Microwave Theory and Techniques, pp. 435-440, July 1965 discloses a method of voltage peak detection at two points along a transmission line. This provides information on the voltage standing wave ratio (VSWR), which can be used to estimate impedance.

"Antenna impedance mismatch measurement and correction for adaptive CDMA transceivers", D. Qiao, D. Choi, Y. Zhao, D. Kelly, T. Hung, D. Kimball, M. Li, P. Asbeck, IEEE International Microwave Symposium Digest, pp. 783-786, June 2005 discloses voltage peak detection at three nodes. This provides information on the real and imaginary part of the impedance, but in a non-orthogonal manner.

"Frequency agile antenna tuning and matching", J. R. Moritz, Y. Sun, IEE $8^{th}$ International Conference on HF Radio Systems and Techniques, no 474, pp. 169-174, July 2000 discloses a mixer based quadrature detector in conjunction with a VSWR bridge. This provides information on the reflection coefficient, but not on impedance without calculations.

The disadvantage of the first three methods is the need for additional sensing elements in the RF path that are lossy, introducing extra parasitic capacitance and requiring additional space leading to off chip implementations. Furthermore, these methods only work for the PA and can only work if the PA is activated during the detection process. This consumes a substantial amount of current during the detection process. Most of the currently available impedance detectors involve off-chip components, which add to the bill-of-material.

SUMMARY

In a first aspect, the invention provides an impedance detector for measuring an impedance of a circuit, comprising
a frequency source;
a resistor connected in between the frequency source and the circuit to be measured;
a phase shift circuit for applying a phase shift to a signal from the frequency source, to produce a phase shifted signal;
a first multiplier for mixing the signal from the frequency source with a signal from the measured circuit, to obtain a first mixed signal;
a second multiplier for mixing the phase shifted signal with the signal from the measured circuit, to obtain a second mixed signal;
a processing circuit for determining an indication of an impedance of the measured circuit in dependence on the first mixed signal and the second mixed signal.

By mixing the signal from the circuit to be measured with two signals with different phase shift, obtaining two mixed signals, sufficient information is generated to calculate an estimation of the impedance of the circuit to be measured. This impedance detector provides a low-power solution and makes lossy sensing components in the measured circuit itself unnecessary. All components can be integrated on-chip and therefore no additional off-chip components are needed.

The first multiplier and the second multiplier may be the same multiplier. In such a case, the impedance detector may comprise a switch configured to provide either one of the signal from the frequency source and the phase shifted signal from the frequency source to the multiplier. This way the first mixed signal and the second mixed signal may be generated sequentially reducing the number of multipliers.

The phase shift circuit may be configured to generate a signal which is a 90 degrees phase shifted version of the signal from the frequency source. This facilitates the signal processing, as the phase shifted signal and the signal from the frequency source are substantially orthogonal.

The impedance detector may comprise a switch having a first end connected to the resistor and the multiplier(s), and a second end connected to the circuit to be measured. This switch allows to turn the impedance detector on and off. When the switch is open, the circuit can operate normally. When the switch is closed, the impedance detector can measure the impedance of the circuit.

The impedance detector may comprise a low-pass filter configured to receive an output of the first multiplier and/or the second multiplier. This allows the removal of high frequency signal components that are not necessary for the analysis.

The impedance detector may comprise an analog-to-digital converter configured to receive the output of the low-pass filter or directly from the multiplier(s). This facilitates digital processing of the signals, so that the impedance value can be computed digitally.

The processing circuit may comprise a digital signal processor configured to receive an output of the analog-to-digital converter.

The processing circuit may be configured to compute, based on the first mixed signal, an estimation of $$V_{mix1} \approx \frac{G_c \cdot \hat{V}_{source}^2 \cdot |Z(j\omega_0)| \cdot \cos[\theta(j\omega_0)]}{2R_{sense}},$$

and wherein the processing circuit is configured to compute, based on the second mixed signal, an approximation of $$V_{mix2} \approx \frac{G_c \cdot \hat{V}_{source}^2 \cdot |Z(j\omega_0)| \cdot \sin[\theta(j\omega_0)]}{2R_{sense}},$$

wherein $G_c$ denotes a conversion gain of the first multiplier and/or second multiplier;

$\hat{V}_{source}$ denotes an amplitude of a voltage generated by the frequency source;

$\omega_e$ denotes an angular frequency of the frequency source;

$Z(j\omega_e)$ denotes an impedance of the circuit to be measured;

$\theta(j\omega_e)$ denotes a phase of Z;

$R_{sense}$ denotes the resistor, wherein preferably $R_{sense} \gg Z$.

This is information that is used to determine the impedance.

The processing circuit may be configured to compute $$\theta(j\omega_0) = \tan^{-1}\frac{V_{mix2}}{V_{mix1}},$$

and/or $$|Z(j\omega_0)| = \frac{2R_{sense}\sqrt{V_{mix2}^2 + V_{mix1}^2}}{G_c \cdot \hat{V}_{source}^2}.$$

These parameters are an estimate of the complex impedance of the circuit to be measured. The accuracy may depend, inter alia, on how much the value of $R_{sense}$ is greater than the impedance to be measured.

The circuit to be measured may comprise a matching network and an amplifier network, and the impedance detector may be connected to the circuit to be measured at a connection between the amplifier network and the matching network.

The measured circuit may comprise an adaptive matching network. Further, a control unit may be provided for dynamically configuring the adaptive matching network based on the indication of the impedance of the measured circuit.

In another aspect, the invention provides a method of adaptive impedance matching, comprising measuring an impedance of a measured circuit using the impedance detector set forth.

The person skilled in the art will understand that the features described above may be combined in any way deemed useful. Moreover, modifications and variations described in respect of the system may likewise be applied to the method, and modifications and variations described in respect of the method may likewise be applied to the system.

BRIEF DESCRIPTION OF THE DRAWINGS

In the following, aspects of the invention will be elucidated by means of examples, with reference to the drawings. The drawings are diagrammatic and may not be drawn to scale.

DESCRIPTION

In the following, the invention will be explained further by means of examples. These examples are intended to facilitate an understanding of the invention. However, the description of the examples are not intended to limit the scope of the invention.

Figure 1:
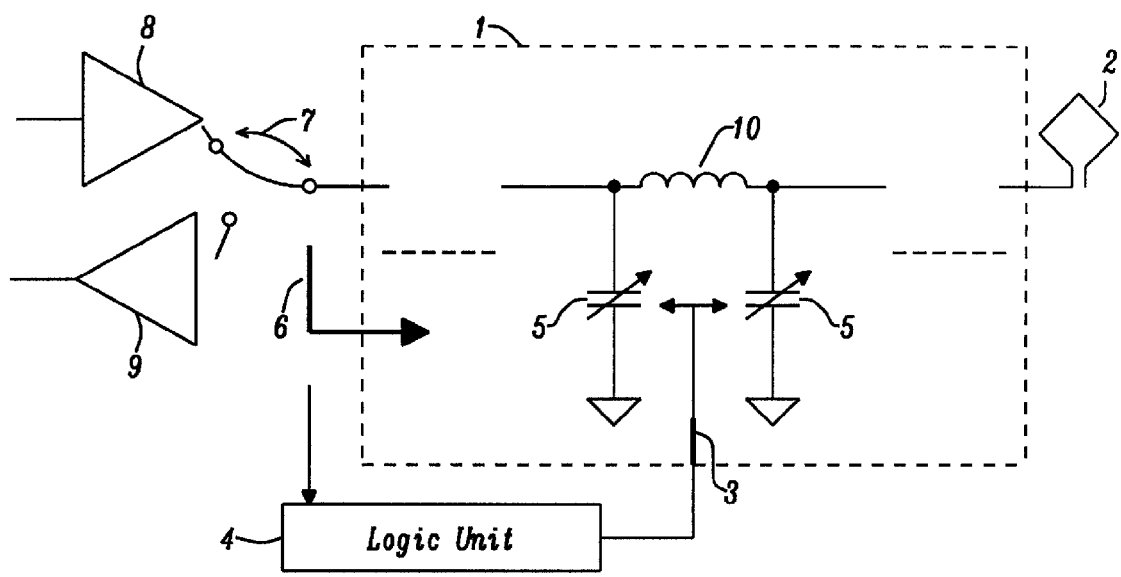
FIG. 1 illustrates an example of a radio frequency (RF) frontend configuration.

FIG. 1 illustrates an example of a radio frequency (RF) frontend configuration. The output of the power amplifier (PA) 8 and the input of the low-power noise amplifier (LNA) 9 are connected to a common matching network 1 or to two separate matching networks (not shown). The matching network may further be connected to an antenna 2, in a way known in the art per se. The matching network 1 may, as an example, comprise tunable capacitors 5 and coil 10. A switching device (S) 7 is operative to switch between the transmit and receive mode. An impedance detector 6 is operative to measure an impedance, so that the adaptive matching network 1 may be tuned. For example, this may be done by a logic unit 4 operative to receive the impedance measurement and configure tunable capacitators 5.

Although in the above example the impedance detector is used in conjunction with an impedance matching network, the impedance detector described herein is not limited to such an application. For example, the impedance detector may also be used in a proximity detector.

The system depicted in FIG. 1 shows an adaptive matching network 1 which has tuneable elements. In most applications, these tuneable elements are tunable capacitors 5 but could also be implemented in other ways, for example as a combination of tuneable capacitors, inductors, transformers and/or gyrators. In this example, a Pi configuration matching network with shunt capacitors is used, but other matching network topologies with either series or shunt capacitors are also possible. The tuneable capacitors can be implemented in several ways, using for example varactors or capacitors with switches that switch digitally between Con and Coff, as known in the art per se.

One use of an impedance detector is to detect the complex impedance before each period of reception (Rx) or transmission (Tx) activity, which measures the change in the antenna impedance due to a change in the environment. This change can be caused by touching the antenna, placing it on a metal plate, placing it close to a human body, etc. Based on the value of the detected impedance, some logical operations can be performed based on an algorithm (which may be application specific) and the output of the logic unit 4 is used to control the tuneable elements in order to restore the optimum impedance to obtain the optimal performance.

This system can also be used when different PA output power levels are foreseen. In this case the matching network can be switched to obtain the optimum impedance for the highest efficiency. It can also be used to detect the direct environment of the antenna, for example by measuring the input impedance of the antenna through the matching network or directly at the terminal of the antenna itself.

In the following, an impedance detector design will be disclosed in more detail. This impedance detector may be applied in the above described scenario. However, other applications are very well possible.

Figure 2:
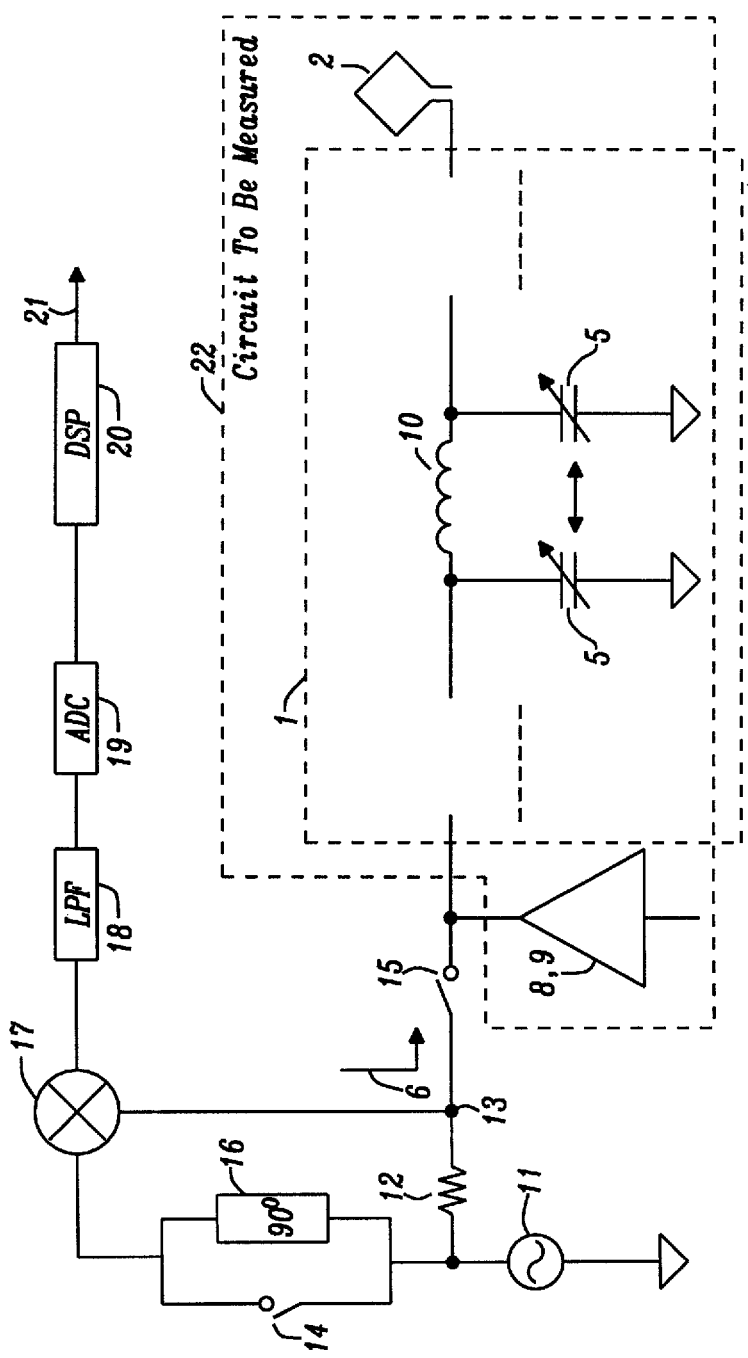
FIG. 2 is a block diagram of an impedance detector and a circuit to be measured.

FIG. 2 is a block diagram of an impedance detector. The reference numerals relating to the adaptive matching network 1, antenna 2, PA 8, and LNA 9 have been copied from FIG. 1. It is noted that those elements are not part of the impedance detector and may be omitted or replaced by any other circuit of which the impedance should be measured.

In normal operation mode, i.e. when a measurement is not taking place, switch2 15 is not-conducting, and the measured circuit can operate normally without being influenced by the impedance detector. For example, in the specific application illustrated in FIG. 2, the PA output 8 and/or LNA input 9 is connected to the matching network 1. During the detection phase, switch2 15 is conductive and the PA/LNA 8/9 is switched off. In this case the off-impedance of the PA/LNA 8/9 may still be loading the matching network 1. Since the switch2 15 does not come in series with the signal path, there is no loss of transmit or receive power.

In the detection mode, a signal generator 11 along with a sensing resistor 12, 'Rsense', is applied to the measured circuit. Although a sensing resistor is used in the example, another type of resistor may also be used. The signal generator 11 can be a low-power oscillator with a fixed frequency or a programmable frequency. The description below takes voltage as the reference signal to perform the calculations. However, the calculations may be adapted to support a different reference signal.

The voltage generated by the signal generator 11, $V_{source}(t) = \hat{V}_{source} \cos(\omega t)$, is divided between the sense resistor 12 and the impedance Z, transformed by the circuit to be measured 22. Hence, after Fourier transformation:

$$V_{imp}(j\omega) = V_{source}(j\omega) \frac{Z(j\omega)}{R_{sense} + Z(j\omega)}, \quad \text{(Equation 1)}$$

with $Z(j\omega) = |Z(j\omega)| \exp[j\theta(j\omega)]$

Here θ denotes the phase of the transformed impedance Z and ω is the angular frequency. If one chooses $R_{sense} \gg |Z(j\omega_e)|$, where $\omega_e$ is the angular frequency of the generator, then Equation 1 can be approximated as $$V_{imp}(j\omega_0) \approx \frac{V_{source}(j\omega_0) \cdot |Z(j\omega_0)| \exp[j\theta(j\omega_0)]}{R_{sense}}.$$

After inverse Fourier transformation, $$V_{imp}(t) \approx \frac{V_{source}(t) \cdot |Z(j\omega_0)| \cdot \cos[\omega_0 t + \theta(j\omega_0)]}{R_{sense}}$$

The detection is done in two steps. In the first step, switch1 14 is conductive and hence $V_{source} \cos(\omega t)$ is directly connected to the input of the multiplier 17. After mixing and rejecting the higher frequency term and taking the DC term by passing it through a low pass filter, one gets $$Vmix_{switch1,on} = \frac{G_c \cdot \hat{V}_{source}^2 \cdot |Z(j\omega_0)| \cdot \cos[\theta(j\omega_0)]}{2 R_{sense}}. \quad \text{(Equation 2)}$$

Here $G_c$ denotes the conversion gain of the multiplier 17.

In the second step, the switch1 14 is non-conductive and hence the $V_{source}$ experiences a 90 degrees phase shift before it is applied to the multiplier 17. In this step the output of the low pass filter 18 becomes $$Vmix_{switch1,off} = \frac{G_c \cdot \hat{V}_{source}^2 \cdot |Z(j\omega_0)| \cdot \sin[\theta(j\omega_0)]}{2 R_{sense}}. \quad \text{(Equation 3)}$$

One can see that, Equations 2 and 3, in particular $Vmix_{switch1,on}$ and $Vmix_{switch1,off}$, contain all the information one needs to compute the magnitude and phase of the impedance to be measured. The respective equations for the phase and magnitude are given in Equations 4 and 5:

$$\theta(j\omega_0) = \tan^{-1} \frac{Vmix_{switch1,off}}{Vmix_{switch1,on}}, \quad \text{(Equation 4)}$$

and $$|Z(j\omega_0)| = \frac{2 R_{sense} \sqrt{Vmix_{switch1,off}^2 + Vmix_{switch1,on}^2}}{G_c \cdot \hat{V}_{source}^2}. \quad \text{(Equation 5)}$$

These computations can be done in the digital signal processor (DSP) 20 after converting the signals from Equations 2 and 3 with an analog-to-digital converter (ADC) 19.

Equations 2, 3, 4 and 5 show that the estimates of the magnitude and phase of Z are valid in particular for signals at or near the frequency of interest $\omega_e$ and in principle not at other frequencies. Therefore, the estimation can be performed at the frequency where the next Rx or Tx activity will take place. For example, a sinusoidal signal may be generated by the generator.

Figure 3:
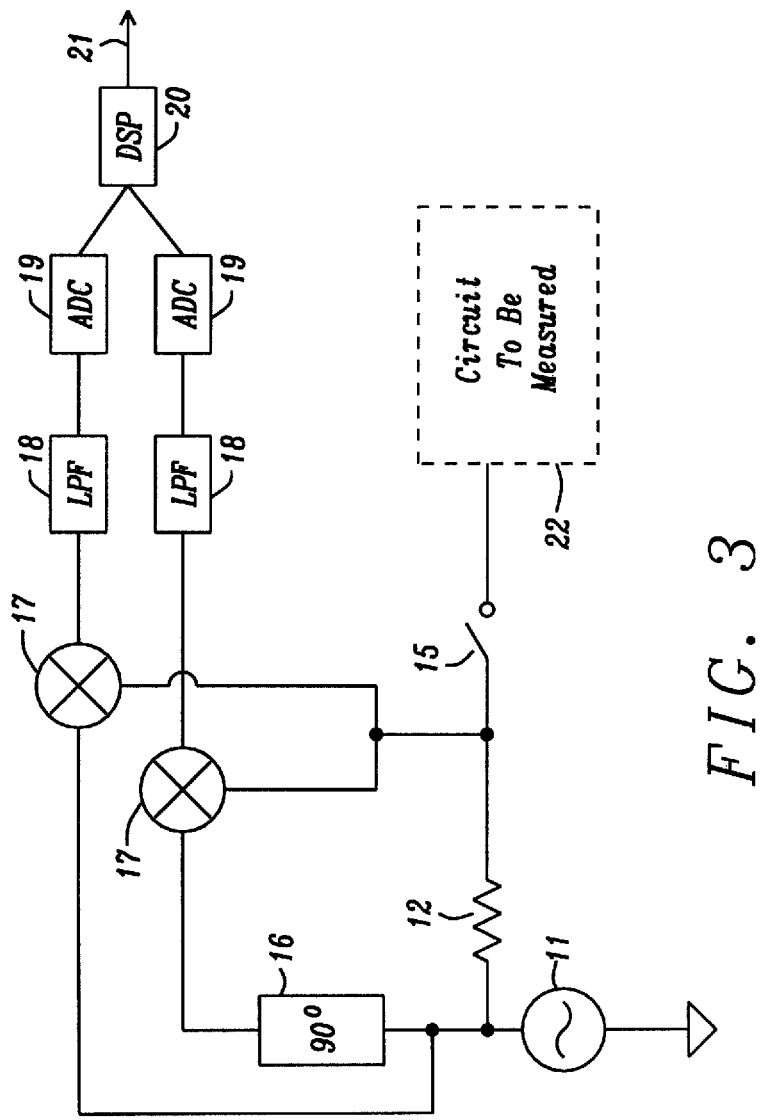
FIG. 3 illustrates an alternative implementation of an impedance detector with two multipliers.

FIG. 3 illustrates an alternative implementation of the impedance detector with two multipliers, wherein the two types of mixed signals (corresponding to switch1 14 closed and open, respectively) can be measured simultaneously. The same reference numerals are used as in FIG. 2, where applicable. The two multipliers 17 generate the two signals, which are processed by two respective low-pass filters 18 and ADC's 19, and the digital signals are combined in the DSP 20. The resulting indication of impedance should be the same or similar to the indication of impedance generated by the circuit of FIG. 2.

The above procedure can also be performed in one step by removing Switch1 14 and the phase shifter 16 if one has I/Q (In-phase/Quadrature) signals from the generator and two multipliers. In that case, one can use an already existing frequency synthesizer in a SOC (system-on-chip) provided it generates I/Q signals and the respective multipliers. The downside of it is that there will be a path from the PA to the synthesizer through Switch2 15 which might compromise the frequency pulling performance. The other downside is the additional load to the oscillator which might compromise other performance parameters.

Alternatively, one can have a separate synthesizer replacing the signal generator 11; the spec of this separate synthesizer can be extremely relaxed compared to any standard synthesizer. The separate synthesizer could also act as a BIST (Built in self-test) for evaluating the Rx characteristics.

The phase shifter 16 can be implemented by a poly phase filter and the switch1 14 can be used to select the signal with and without the phase shift, respectively. For the implementation of the multiplier 17, one possibility is a mixer. In that case, a buffer can be placed after the phase shifter 16 to convert the sinusoidal signal into a square signal to drive the switches of the mixer. Any additional phase shift introduced by this extra buffer may be taken into account in the DSP 20.

A few additional notes are described below which may be used to optionally further enhance the detection process.

Since, the PA or LNA is not active during the detection phase, their "off impedance" is included in the detected impedance. Since these "off-impedances" can be modelled quite accurately, it can be taken into account in the calculations.

The impedance detector disclosed herein can be integrated in a system on chip (SOC) causing very small area penalty because of its low foot print. The complete detector can be placed on-chip, without external off-chip components.

Moreover, the impedance detector does not consume much power, as it does not need the PA or LNA to be working during the detection procedure.

The detector concept is not restricted to PA and/or LNA matching only, but can also be used for other applications.

No additional lossy sensing components are needed in the RF path.

The proposed detector enables a way to detect the changed impedance transformed from the antenna towards the power amplifier (PA) output and low-noise amplifier (LNA) input during transmit and receive respectively. The detection of the impedance enables the tuning of the matching network for the following purposes:

1) Restore the optimum load impedance for the PA during the transmit mode after a change in the antenna impedance.

2) Restore the optimum source impedance for the LNA during the receive mode after a change in the antenna impedance.

3) Optimize the matching network for the optimum PA output power and efficiency when the PA is set to a different output power level during the transmit mode.

The impedance detector may be used as a means to detect the environment or vicinity of the antenna based on the detected impedance results. This can lead to a variety of applications.

By detecting the impedance, the matching network can be tuned for a certain range of antenna impedances without the necessity of adding off-chip components.

The impedance detector may be used in a method to measure the impedance of a circuit to be measured. Optionally, such a method may comprise configuring an adaptive matching network that is part of the circuit to be measured, based on the indication of the impedance provided by impedance detector.

The examples and embodiments described herein serve to illustrate rather than limit the invention. The person skilled in the art will be able to design alternative embodiments without departing from the scope of the claims. Reference signs placed in parentheses in the claims shall not be interpreted to limit the scope of the claims. Items described as separate entities in the claims or the description may be implemented as a single hardware or software item combining the features of the items described.

What is claimed is:

1. An impedance detector for measuring an impedance of a circuit, comprising
   a frequency source;
   a resistor connected in between the frequency source and the circuit to be measured;
   a phase shift circuit for applying a phase shift to a signal from the frequency source, to produce a phase shifted signal;
   at least one multiplier for mixing the signal from the frequency source with a signal from the circuit to be measured, to obtain a first mixed signal and mixing the phase shifted signal with the signal from the circuit to be measured, to obtain a second mixed signal;
   a processing circuit for determining an indication of an impedance of the circuit to be measured in dependence on the first mixed signal and the second mixed signal, and
   a switch having a first end connected to the resistor and said at least one multiplayer, and a second end connected to the circuit to be measured.

2. The impedance detector of claim 1, further comprising a low-pass filter configured to receive an output of said at least one multiplier.

3. The impedance detector of claim 2, further comprising an analog-to-digital converter configured to receive an output of the low-pass filter.

4. The impedance detector of claim 3, wherein the processing circuit comprises a digital signal processor configured to receive an output of the analog-to-digital converter.

5. The impedance detector of claim 1, wherein the processing circuit is configured to compute, based on the first mixed signal, an estimation of $$V_{mix1} = \frac{G_c \cdot \hat{V}_{source}^2 \cdot |Z(j\omega_0)| \cdot \cos[\theta(j\omega_0)]}{2R_{sense}},$$

and wherein the processing circuit is configured to compute, based on the second mixed signal, an approximation of $$V_{mix2} = \frac{G_c \cdot \hat{V}_{source}^2 \cdot |Z(j\omega_0)| \cdot \sin[\theta(j\omega_0)]}{2R_{sense}},$$

wherein
   $G_e$ denotes a conversion gain of the first multiplier and/or second multiplier;
   $\hat{V}_{source}$ denotes an amplitude of a voltage generated by the frequency source;
   $\omega_o$ denotes an angular frequency of the frequency source;
   $Z(j\omega_o)$ denotes an impedance of the circuit to be measured;
   $\theta(j\omega_o)$ denotes a phase of Z;
   $R_{sense}$ denotes the resistor.

6. The impedance detector of claim 5, wherein the processing circuit is configured to compute $$\theta(j\omega_0) = \tan^{-1}\frac{V_{mix2}}{V_{mix1}},$$

and/or $$|Z(j\omega_0)| = \frac{2R_{sense}\sqrt{V_{mix2}^{2\Box} + V_{mix1}^2}}{G_c \cdot \hat{V}_{source}^2}.$$

7. The impedance detector of claim 6, wherein $R_{sense} \gg |Z|$.

8. The impedance detector of claim 1, wherein said at least one multiplier is one multiplier, and further comprising a switch configured to provide either one of the signal from the frequency source and the phase shifted signal to the one multiplier.

9. The impedance detector of claim 1, wherein the phase shift circuit is configured to generate a signal which is a 90 degrees phase shifted version of the signal from the frequency source.

10. The impedance detector of claim 1, wherein the resistor comprises a sense resistor.

11. The impedance detector of claim 1, wherein the circuit to be measured comprises an adaptive matching network and an amplifier network, and the impedance detector is connected to the circuit to be measured at a connection between the amplifier network and the adaptive matching network.

12. The impedance detector of claim 1, wherein the circuit to be measured comprises an adaptive matching network, and further comprising a control unit for dynamically configuring the adaptive matching network based on the indication of the impedance of the circuit to be measured.

13. The impedance detector of claim 1, wherein the circuit to be measured and the impedance detector are implemented on the same system-on-a-chip.

14. The impedance detector of claim 1, wherein said at least one multiplier comprises a first multiplier for mixing the signal from the frequency source with the signal from the circuit to be measured and a second multiplier for mixing the phase shifted signal with the signal from the circuit to be measured.

15. A method of adaptive impedance matching and measuring an impedance of a circuit, comprising the steps of:
providing a frequency source;
providing a resistor connected in between the frequency source and the circuit to be measured;
applying a phase shift to a signal from the frequency source, to produce a phase shifted signal using a phase shift circuit;
mixing the signal from the frequency source with a signal from the circuit to be measured, to obtain a first mixed signal, and
mixing the phase shifted signal with the signal from the circuit to be measured, to obtain a second mixed signal using at least one multiplier;
determining an indication of an impedance of the circuit to be measured in dependence on the first mixed signal and the second mixed signal using a processing circuit, and
providing a switch having a first end connected to the resistor and said at least the one multiplier, and a second end connected to the circuit to be measured.

16. The method of adaptive impedance matching and measuring an impedance of a circuit of claim 15, further comprising the step of:
receiving an output of said at least one multiplier using a low-pass filter.

17. The method of adaptive impedance matching and measuring an impedance of a circuit of claim 16, further comprising the step of:
receiving an output of the low-pass filter using an analog-to-digital converter.

18. The method of adaptive impedance matching and measuring an impedance of a circuit of claim 17, further comprising the step of:
receiving an output of the analog-to-digital converter using a digital signal processor.

19. The method of adaptive impedance matching and measuring an impedance of a circuit of claim 15, further comprising the step of:
computing, based on the first mixed signal, an estimation of $$V_{mix1} = \frac{G_c \cdot \hat{V}_{source}^2 \cdot |Z(j\omega_0)| \cdot \cos[\theta(j\omega_0)]}{2R_{sense}},$$

using the processing circuit
computing, based on the second mixed signal, an approximation of $$V_{mix2} = \frac{G_c \cdot \hat{V}_{source}^2 \cdot |Z(j\omega_0)| \cdot \sin[\theta(j\omega_0)]}{2R_{sense}},$$

wherein
$G_e$ denotes a conversion gain of the first multiplier and/or second multiplier;
$\hat{V}_{source}$ denotes an amplitude of a voltage generated by the frequency source;
$\omega_o$ denotes an angular frequency of the frequency source;
$Z(j\omega_o)$ denotes an impedance of the circuit to be measured;
$\theta(j\omega_o)$ denotes a phase of Z;
$R_{sense}$ denotes the resistor
using the processing circuit.

20. The method of adaptive impedance matching and measuring an impedance of a circuit of claim 19, further comprising the step of:
computing $$\theta(j\omega_0) = \tan^{-1}\frac{V_{mix2}}{V_{mix1}},$$

and/or $$|Z(j\omega_0)| = \frac{2R_{sense}\sqrt{V_{mix2}^{2\square} + V_{mix1}^2}}{G_c \cdot \hat{V}_{source}^2}$$

using the processing circuit.

21. The method of adaptive impedance matching and measuring an impedance of a circuit of claim 20, wherein $R_{sense} \gg |Z|$.

22. The method of adaptive impedance matching and measuring an impedance of a circuit of claim 15, wherein said at least one multiplier is one multiplier, and further comprising a step of:
providing either one of the signals from the frequency source or the phase shifted signal to the one multiplier using a switch.

23. The method of adaptive impedance matching and measuring an impedance of a circuit of claim 15, further comprising the step of:
generating a signal which is a 90 degrees phase shifted version of the signal from the frequency source using the phase shift circuit.

24. The method of adaptive impedance matching and measuring an impedance of a circuit of claim 15, wherein the resistor comprises a sense resistor.

25. The method of adaptive impedance matching and measuring an impedance of a circuit of claim 15, wherein the circuit to be measured comprises an adaptive matching network and an amplifier network, and the impedance detector is connected to the circuit to be measured at a connection between the amplifier network and the adaptive matching network.

26. The method of adaptive impedance matching and measuring an impedance of a circuit of claim 15, wherein the circuit to be measured comprises an adaptive matching network, and further comprising a control unit for dynamically configuring the adaptive matching network based on the indication of the impedance of the circuit to be measured.

27. The method of adaptive impedance matching and measuring an impedance of a circuit of claim 15, wherein the circuit to be measured and the impedance detector are implemented on the same system-on-a-chip.

28. The method of adaptive impedance matching and measuring an impedance of a circuit of claim 15, wherein said at least one multiplier comprises a first multiplier and a second multiplier, wherein the signal from the frequency source is mixed with the signal from the circuit to be measured using the first multiplier and the phase shifted signal is mixed with the signal from the circuit to be measured using the second multiplier.

* * * * *